(12) United States Patent
Lee et al.

(10) Patent No.: US 7,883,388 B2
(45) Date of Patent: Feb. 8, 2011

(54) MANUFACTURING OF DISPLAY DEVICE

(75) Inventors: Sung-soo Lee, Gyeonggi-do (KR);
Jae-hoon Jung, Gyeonggi-do (KR);
Ji-hye Choi, Gyeonggi-do (KR);
Kyong-tae Park, Gyeonggi-do (KR);
Young-rok Song, Gyeonggi-do (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 317 days.

(21) Appl. No.: 11/980,251

(22) Filed: Oct. 30, 2007

(65) Prior Publication Data
US 2008/0132138 A1 Jun. 5, 2008

(30) Foreign Application Priority Data
Nov. 23, 2006 (KR) .................. 10-2006-0116532

(51) Int. Cl.
*H01J 9/24* (2006.01)
(52) U.S. Cl. ...................................... 445/24

(58) Field of Classification Search ............. 445/24, 445/25
See application file for complete search history.

(56) References Cited

U.S. PATENT DOCUMENTS

| | | | | |
|---|---|---|---|---|
| 4,728,898 A | * | 3/1988 | Staley, Jr. | 324/522 |
| 6,621,212 B1 | * | 9/2003 | Pennaz et al. | 313/506 |
| 2003/0143430 A1 | * | 7/2003 | Kawamura et al. | 428/690 |
| 2005/0227111 A1 | * | 10/2005 | Hosokawa et al. | 428/690 |

* cited by examiner

*Primary Examiner*—Joseph L Williams
*Assistant Examiner*—Hana S Featherly
(74) *Attorney, Agent, or Firm*—Innovation Counsel LLP

(57) ABSTRACT

A method of manufacturing a display device having a display panel that includes a first electrode, a light emitting layer formed on the first electrode, and a second electrode on the light emitting layer, the manufacturing method comprising: aging the display panel by applying a predetermined electrical signal and a predetermined temperature so that the luminance of the light emitting layer lies between about 10 nits and 10,000 nits.

7 Claims, 17 Drawing Sheets
(11 of 17 Drawing Sheet(s) Filed in Color)

| Aging condition | INITIAL LUMINANCE REDUCTION TIME (hr-ΔL2%) | INITIAL LUMINANCE REDUCTION TIME INCREASE RATE(%) | CC LIFETIME (hrs) | CC LIFETIME INCREASE RATE(%) | ΔVth(V) | ΔVth REDUCTION RATE(%) | OVERALL LIFETIME (hrs) | OVERALL LIFETIME INCREASE RATE(%) |
|---|---|---|---|---|---|---|---|---|
| (1) No aging | 0.1 | | 529 | | 0.632 | | 124 | |
| (2) 60°C,7V,0.5hr | 0.2 | 213 | 547 | 103 | 0.613 | 97 | 146 | 117 |
| (3) 60°C,7V,2hr | 0.5 | 421 | 616 | 116 | 0.573 | 91 | 189 | 153 |
| (4) 60°C,10V,0.5hr | 0.6 | 550 | 576 | 109 | 0.549 | 87 | 198 | 160 |
| (5) 60°C,10V,2hr | 1.4 | 1254 | 709 | 134 | 0.543 | 86 | 238 | 192 |
| (6) 100°C,7V,0.5hr | 0.6 | 501 | 869 | 164 | 0.545 | 86 | 258 | 208 |
| (7) 100°C,7V,2hr | 1.7 | 1449 | 1089 | 206 | 0.213 | 34 | 564 | 455 |
| (8) 100°C,10V,0.5hr | 1.2 | 1031 | 930 | 176 | 0.426 | 67 | 363 | 293 |
| (9) 100°C,10V,2hr | 2.6 | 2297 | 1031 | 195 | 0.113 | 18 | 631 | 509 |

FIG. 4

| Aging condition | INITIAL LUMINANCE REDUCTION TIME (hr-ΔL2%) | INITIAL LUMINANCE REDUCTION TIME INCREASE RATE(%) | CC LIFETIME (hrs) | CC LIFETIME INCREASE RATE(%) | ΔVth(V) | ΔVth REDUCTION RATE(%) | OVERALL LIFETIME (hrs) | OVERALL LIFETIME INCREASE RATE(%) |
|---|---|---|---|---|---|---|---|---|
| (1) No aging | 0.1 | | 529 | | 0.632 | | 124 | |
| (2) 60°C, 7V, 0.5hr | 0.2 | 213 | 547 | 103 | 0.613 | 97 | 146 | 117 |
| (3) 60°C, 7V, 2hr | 0.5 | 421 | 616 | 116 | 0.573 | 91 | 189 | 153 |
| (4) 60°C, 10V, 0.5hr | 0.6 | 550 | 576 | 109 | 0.549 | 87 | 198 | 160 |
| (5) 60°C, 10V, 2hr | 1.4 | 1254 | 709 | 134 | 0.543 | 86 | 238 | 192 |
| (6) 100°C, 7V, 0.5hr | 0.6 | 501 | 869 | 164 | 0.545 | 86 | 258 | 208 |
| (7) 100°C, 7V, 2hr | 1.7 | 1449 | 1089 | 206 | 0.213 | 34 | 564 | 455 |
| (8) 100°C, 10V, 0.5hr | 1.2 | 1031 | 930 | 176 | 0.426 | 67 | 363 | 293 |
| (9) 100°C, 10V, 2hr | 2.6 | 2297 | 1031 | 195 | 0.113 | 18 | 631 | 509 |

FIG. 10

| Aging condition | INITIAL LUMINANCE REDUCTION TIME (hr-ΔL2%) | INITIAL LUMINANCE REDUCTION TIME INCREASE RATE(%) | CC LIFETIME (hrs) | CC LIFETIME INCREASE RATE(%) | ΔVth(V) | ΔVth REDUCTION RATE(%) | OVERALL LIFETIME (hrs) | OVERALL LIFETIME INCREASE RATE(%) |
|---|---|---|---|---|---|---|---|---|
| (1)No aging | 0.5 | | 1064 | | 1.000 | | 118 | |
| (2)CC,80°C,3000nbit,2hrs | 1.1 | 201 | 929 | 87 | 0.743 | 74 | 186 | 157 |
| (3)CC,80°C,5000nbit,2hrs | 1.2 | 212 | 883 | 83 | 0.654 | 65 | 213 | 180 |
| (4)CC,100°C,3000nbit,2hrs | 0.7 | 134 | 728 | 68 | 0.777 | 78 | 163 | 137 |
| (5)CC,100°C,5000nbit,2hrs | 0.7 | 127 | 556 | 52 | 0.744 | 74 | 157 | 132 |
| (6)PCV,80°C,3000nbit,4hrs | 1.0 | 190 | 829 | 78 | 0.732 | 73 | 184 | 156 |
| (7)PCV,80°C,5000nbit,4hrs | 1.3 | 247 | 807 | 76 | 0.672 | 67 | 203 | 172 |
| (8)PCV,100°C,3000nbit,4hrs | 0.6 | 104 | 575 | 54 | 0.830 | 83 | 141 | 119 |
| (9)PCV,100°C,5000nbit,4hrs | 0.7 | 134 | 558 | 52 | 0.756 | 76 | 159 | 134 |

FIG. 14

| Aging condition | INITIAL LUMINANCE REDUCTION TIME (hr-ΔL2%) | INITIAL LUMINANCE REDUCTION TIME INCREASE RATE(%) | CC LIFETIME (hrs) | CC LIFETIME INCREASE RATE(%) | ΔVth(V) | ΔVth REDUCTION RATE(%) | OVERALL LIFETIME (hrs) | OVERALL LIFETIME INCREASE RATE(%) |
|---|---|---|---|---|---|---|---|---|
| (1) No aging | 1.3 |  | 988 |  | 0.943 |  | 212 |  |
| (2) CC, 80°C, 3000nit, 2hrs | 2.4 | 184 | 693 | 70 | 0.562 | 60 | 324 | 153 |
| (3) CC, 80°C, 5000nit, 2hrs | 3.5 | 262 | 763 | 77 | 0.518 | 55 | 361 | 170 |
| (4) CC, 100°C, 3000nit, 2hrs | 2.8 | 207 | 849 | 86 | 0.530 | 56 | 375 | 177 |
| (5) CC, 100°C, 5000nit, 2hrs | 2.7 | 201 | 671 | 68 | 0.546 | 58 | 307 | 145 |
| (6) PCV, 80°C, 3000nit, 4hrs | 2.9 | 221 | 897 | 91 | 0.567 | 60 | 379 | 178 |
| (7) PCV, 80°C, 5000nit, 4hrs | 2.5 | 188 | 713 | 72 | 0.564 | 60 | 323 | 152 |
| (8) PCV, 100°C, 3000nit, 4hrs | 2.8 | 207 | 951 | 96 | 0.481 | 51 | 437 | 206 |
| (9) PCV, 100°C, 5000nit, 4hrs | 3.1 | 230 | 883 | 89 | 0.468 | 50 | 421 | 198 |

US 7,883,388 B2

MANUFACTURING OF DISPLAY DEVICE

CROSS-REFERENCE TO RELATED APPLICATIONS

This application claims priority from Korean Patent Application No. 2006-0116532, filed on Nov. 23, 2006 in the Korean Intellectual Property Office, the disclosure of which is incorporated herein by reference.

BACKGROUND OF INVENTION

1. Field of Invention

Methods consistent with the present invention relate to a manufacturing of a display device and, more particularly, to a display device manufacturing method comprising an aging process.

2. Description of the Related Art

Recently, flat panel displays such as liquid crystal displays (LCDs) and organic light emitting diodes (OLEDs) have been widely used to replace existing cathode ray tubes (CRTs) because of their low driving voltage, lightweight, thinness, wide viewing angle, and high speed response. An OLED comprising an organic light emitting layer that is supplied with electrons and holes and emits light when the electrons are recombined with the holes. The intensity of light emitted from the organic light emitting layer depends on the amount of holes supplied from a pixel electrode connected to a thin film transistor. However, the OLED has a problem in that the organic light emitting layer deteriorates with use, thereby shortening its lifetime and requiring greater driving voltage as time goes on. In addition, the OLED may acquire an irreversible afterimage effect due to luminance decrease after initial emission.

SUMMARY OF THE INVENTION

Accordingly, it is an aspect of the present invention to provide a method of manufacturing a display device, which is capable of increasing the durability of the light emitting layer and decreasing the rate of increase of driving voltage.

According to one aspect of the invention a process for making a display panel having a first electrode, a light emitting layer formed on the first electrode, and a second electrode on the light emitting layer, comprises: aging the display panel by applying a predetermined electrical signal and a predetermined temperature so that the luminance of the light emitting layer lies between about 10 nits and 10,000 nits.

According to an illustrative embodiment of the present invention, the predetermined electrical signal for aging the display panel comprises a predetermined level of direct power.

According to the embodiment of the present invention, the direct power is a direct voltage.

According to the embodiment of the present invention, a level of the direct voltage is about 5 to 15 V.

According to the embodiment of the present invention, the direct power is a direct current.

According to the embodiment of the present invention, the aging the display panel comprises applying an alternating power to the display panel.

According to the embodiment of the present invention, the alternating power is an alternating current.

According to the embodiment of the present invention, the alternating power is an alternating voltage.

According to the embodiment of the present invention, pulse amplitude of the alternating voltage is about 5 to 30 V.

According to the embodiment of the present invention, the aging the display panel comprises applying a predetermined level of direct voltage and a predetermined level of direct current alternately to the display panel.

According to the embodiment of the present invention, a frequency of the alternating power is 50 to 10,000 Hz.

According to the embodiment of the present invention, a duty cycle of the alternating power is about 10 to 90%.

According to the embodiment of the present invention, the aging the display panel lasts for about 0.5 to 4 hours.

According to the embodiment of the present invention, the aging the display panel comprises heating the display panel at temperature of about 70 to 120° C.

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee. The above and/or other aspects of the present invention will become apparent and more readily appreciated from the following description of the exemplary embodiments, taken in conjunction with the accompanying drawings, in which:

FIGS. 4 to 8 are views for explaining the aging of the display device according to the first exemplary embodiment of the invention;

FIGS. 9 to 13 are views for explaining the aging of a display device according to a second exemplary embodiment of the invention; and FIGS. 14 to 17 are views for explaining the aging of a display device according to a third exemplary embodiment of the invention.

DETAILED DESCRIPTION

Figure 1:
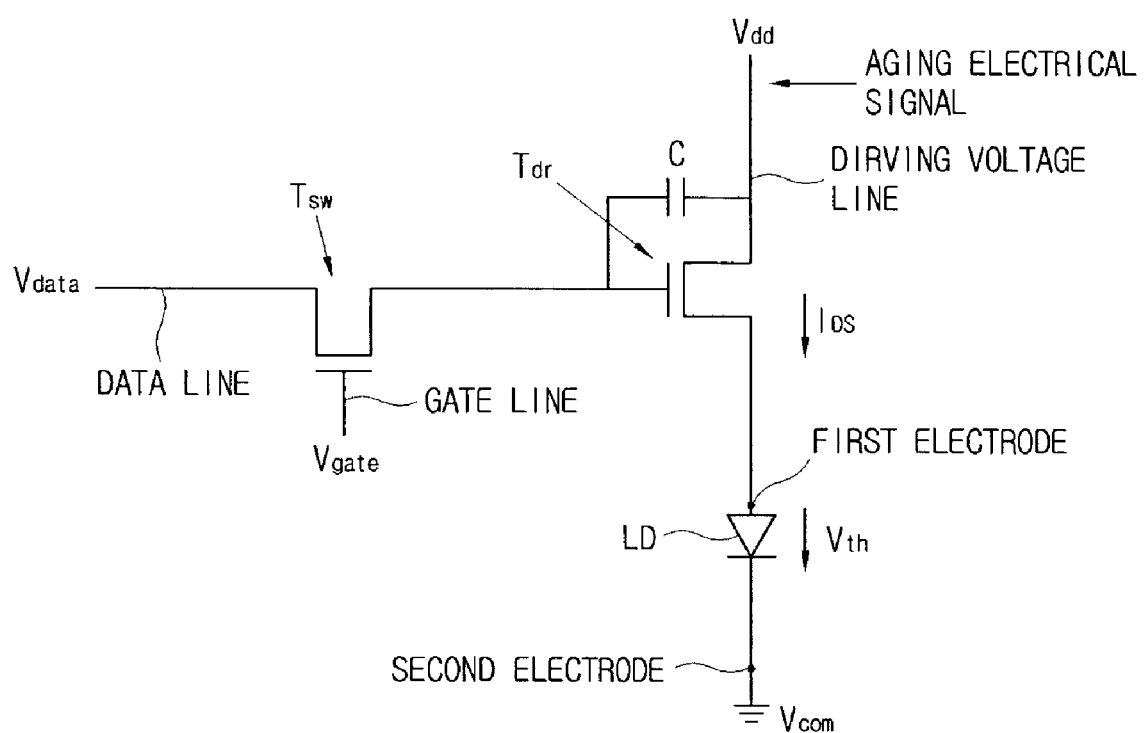
FIG. 1 is an equivalent circuit diagram of a pixel of a display device according to an exemplary embodiment of the invention.

In the following exemplary embodiments, the same components are denoted by the same reference numerals, and explanation thereof will be representatively given in a first exemplary embodiment but will be omitted in other exemplary embodiments.

Figure 2:
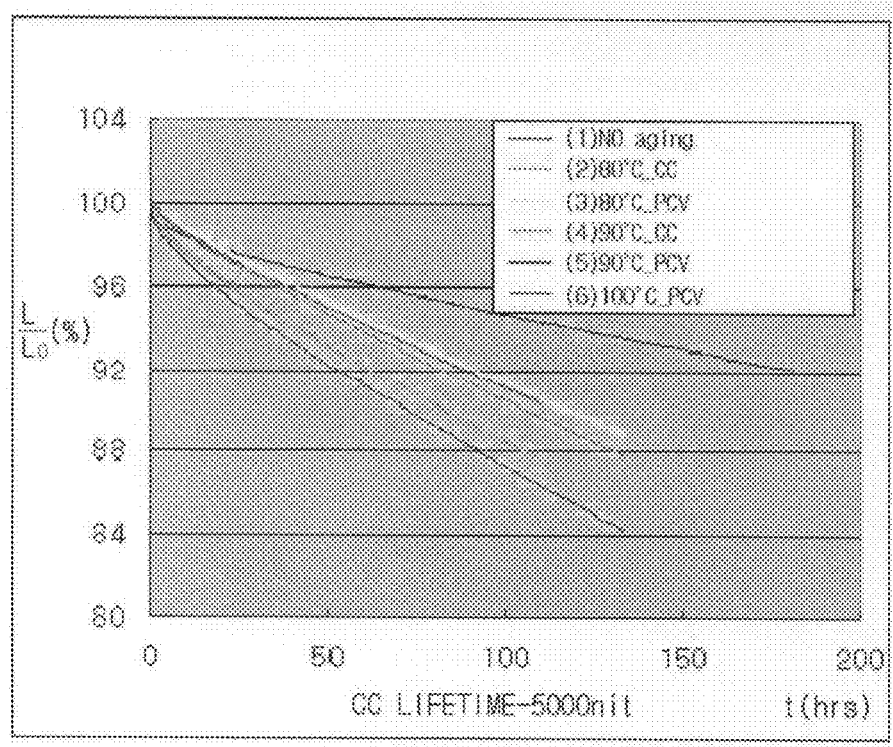
FIG. 2 is a graph for explaining the aging of the luminance of the display device according to the exemplary embodiment of the invention.

FIG. 1 is an equivalent circuit diagram of a pixel of a display device according to an exemplary embodiment of the invention, and FIG. 2 is a graph for explaining an aging luminance condition of the display device according to the exemplary embodiment of the invention.

One pixel is provided with a plurality of signal lines. The signal lines comprise a gate line that transmits a gate voltage Vgate corresponding to a scan signal, a data line that transmits a data voltage Vdata, and a driving voltage line that transmits a driving voltage Vdd. The data line and the driving voltage line are arranged in parallel and adjacent to each other, and the gate line extends perpendicular to the data line and the driving voltage line.

The pixel comprises an organic light diode layer LD, a switching transistor Tsw, a driving transistor Tdr and a capacitor C.

The switching transistor Tsw has a control terminal that corresponds to a gate electrode and is connected to the gate line, an input terminal that corresponds to a drain electrode and is connected to the data line, and an output terminal that corresponds to a source electrode and is connected to the gate electrode which is a control terminal of the driving transistor Tdr. The switching transistor Tsw transmits the data voltage, which is applied to the data line, to the driving transistor Tdr according to the scan signal applied to the gate line.

The driving transistor Tdr also has its control terminal connected to the switching transistor Tsw, an input terminal connected to the driving voltage line, and an output terminal connected to the organic light diode layer LD.

The capacitor C is connected between the control terminal and the input terminal of the driving transistor Tdr. The capacitor C is charged and maintained with the data voltage Vdata inputted to the control terminal of the driving transistor Tdr.

The organic light diode layer LD is formed between a first electrode as an anode connected to the output terminal of the driving transistor Tdr and a second electrode as a cathode that supplies a common voltage Vcom. The intensity of light emitted from the organic light diode layer LD is varied depending on output current IDS of the driving transistor Tdr. The organic light diode layer LD has its own threshold voltage Vth that increases with the elapse of time during which current flows through the organic light diode layer LD. The increase of the threshold voltage Vth causes an increase in the driving voltage which results in a decrease in the life of the display device.

In this exemplary embodiment, in order to improve the lifetime and efficiency, and test the reliability of the display device, a the display device is made by forming the switching transistor Tsw, the driving transistor Tdr, the first electrode, the organic light diode layer LD and the second electrode on an insulating substrate to complete a display panel, and then applying an electrical signal and heat to the display panel. This operation of applying the electrical signal and heat to the display panel, which is called an aging process, is carried out to reduce initial defects of the display device. In the aging process according to this exemplary embodiment, the electrical signal and heat are simultaneously applied to the display panel.

The electrical signal used for the aging process may be either direct power or alternating power that is applied to the input terminal of the driving transistor Tdr connected to the organic light diode layer LD. The second electrode through which current of the organic light diode layer LD flows out is typically connected to a ground terminal. The direct power may be applied as a constant voltage (CV) or constant current (CC), and the alternating power may be applied as a pulse voltage (PV) or pulse current (PC). Alternatively, in addition to the PV and PC, the alternating power may be applied as a pulse current-voltage (PCV) that alternates between a direct voltage having a predetermined level and a direct current having a predetermined level. In this case, a high pulse signal is controlled with a current and a low pulse signal is controlled with a voltage. Hereinafter, electrical signals applied in the aging process are named abbreviations such as CC, CV, PC, PV, PCV, and the like.

The electrical signals for the aging process according to the exemplary embodiment of the invention are so adjusted that luminance of light emitted from the organic light diode layer LD falls within a range of about 10 to 10,000 nits. Particularly, it is preferable but not necessary that the span of life of the display panel remarkably increases when the luminance of light falls within a range of 3,000 to 5,000 nits. A range of voltage or current applied for the aging operation may be typically adjusted depending on a particular luminance, and, in this exemplary embodiment, the magnitude of current is proportional to the luminance of light.

FIG. 2 is a graph showing the span of life of a display panel which has gone through an aging process. The span of life of the display panel shown in FIG. 2 means a luminance decrease rate with time when the aging-processed display panel is applied with constant current (CC) which can represent luminance of 5,000 nits for the display panel, which will be named CC lifetime. In the graph, an X axis represents time and a Y axis represents a luminance decrease rate to initial luminance ($L/L_0$). If the initial luminance when the CC lifetime begins to be measured is assumed to be 100%, the initial luminance decreases with time. Accordingly, as a decrease gradient of the curve becomes smooth with time, the CC lifetime of the display panel becomes further prolonged As can be seen from the graph of FIG. 2, a first curve 1 represents the CC lifetime of a display panel, which is not aging-processed, and second to sixth curves 2 to 6 represent the CC lifetimes of display panels, which are aging-processed under different aging conditions. In the aging process, the display panels corresponding to the second and third curves 2 and 3 are applied with the temperature of 80° C., the display panels corresponding to the fourth and fifth curves 4 and 5 are applied with the temperature of 90° C., and the display panel corresponding to the sixth curve 6 is applied with the temperature of 100° C. In addition, the display panels corresponding to the second and fourth curves 2 and 4 are applied with CC, and the display panels corresponding to the remaining curves 3, 5 and 6 are applied with PCV.

Typically, the lifetime of the aging-processed display panel has an initial luminance decrease characteristics varying depending on the level of applied voltage or current. Specifically, a higher initial stress reduces the rate at which luminance decreases. However, it can be seen from the graph of FIG. 2 that, if a too high stress, for example, a stress which generates luminance of greater than 10,000 nits, is applied to the display panel, the CC lifetime of the aging-processed display panel becomes shorter than the CC lifetime of the display panel which is not aging-processed. From the fact that the sixth curve 6 corresponding to the display panel applied with the highest temperature of 100° C. has the steepest slope, it can be seen that temperature applied in the aging process has a great effect on the stress. In addition, from the fact that the slope of the curve when the CC is applied to the display panel is steeper than the slope of the curve when the PCV is applied to the display panel, it can be seen that a direct electrical signal causes stress higher than a pulsed electrical signal does.

In conclusion, since the stress which generates the luminance of greater than 10,000 nits has an adverse effect on the lifetime of the display panel, it is appropriate that an electrical signal for the aging process needs to be provided to cause a stress which generates luminance of less than 10,000 nits.

Figure 3:
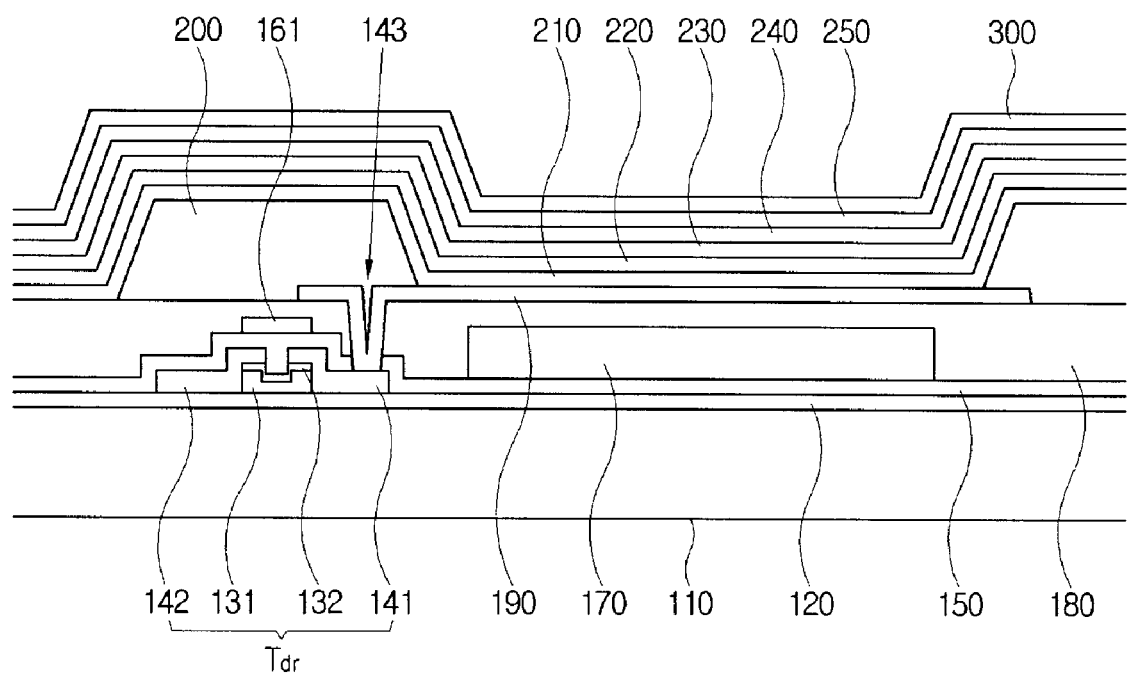
FIG. 3 is a sectional view of a display device according to a first exemplary embodiment of the invention.

FIGS. 3 to 8 are views for explaining an aging operation of a display device according to a first exemplary embodiment of the invention. FIG. 3 is a sectional view of a display panel according to the first exemplary embodiment, and FIGS. 4 to 8 are views for explaining an aging effect of the display panel according to the first exemplary embodiment. FIG. 3 shows only the driving transistor Tdr without the switching transistor Tsw.

A buffer layer 120 is formed on an insulating substrate 110 made of an insulating material such as glass, quartz, ceramic or plastic. The buffer layer 120 may be made of silicon oxide (SiOx) and prevents impurities from being introduced from the insulating substrate 110 into a semiconductor layer 131 in a crystallization process of the semiconductor layer 131.

The semiconductor layer 131 made of polysilicon is formed on the buffer layer 120. An ohmic contact layer 132 is formed on the semiconductor layer 131. The ohmic contact layer 132 is divided into two parts centering on the semiconductor layer 131. A portion of the semiconductor layer 131 between both parts of the ohmic contact layer 132 comprises a channel region. The portion of the semiconductor layer 131 in the channel region is smaller in thickness than a portion of the semiconductor layer 131 below both parts of the ohmic contact layer 132. The ohmic contact layer 132 is made of n+polysilicon with n+ impurities heavily doped therein.

The semiconductor layer 131 and the ohmic contact layer 132 are formed by patterning an amorphous silicon semiconductor layer and an amorphous silicon ohmic contact layer, and crystallizing them with heat, respectively. Amorphous silicon in the amorphous silicon semiconductor layer and the amorphous silicon ohmic contact layer is changed into polysilicon by the crystallizing process. The crystallization process may include a solid phase crystallization (SPC) method, a laser crystallization method, a rapid thermal processing method, and other known crystallization methods in the art.

Among these methods, the SPC method is the oldest and direct method of thermally treating amorphous silicon for a long time at a temperature of less than 600° C. to obtain polysilicon having large crystalline particles. Deposited material may be amorphous material or polysilicon. In order to obtain polysilicon having large crystalline particles, silicon ions or germanium ions are implanted into the deposited material, and the deposited material is amorphized and then is thermally treated for a long time at a temperature of less than 600° C. Laser crystallization is a method of obtaining polysilicon using an excimer laser, annealing laser, or a sequential lateral solidification laser. Rapid thermal processing is a method of depositing amorphous silicon at a low temperature and rapidly thermally treating the surface of the deposited amorphous silicon with light.

A source electrode 141 and a drain electrode 142 are respectively formed on both parts of the ohmic contact layer 132. The source electrode 141 and the drain electrode 142 are simultaneously formed and may comprise a single or multi-metal layer.

A gate insulating film 150 is formed on the drain electrode 142, the source electrode 141, and the semiconductor layer 131. The gate insulating film 150 may be made of silicon nitride (SiNx) or the like.

A gate electrode 161 is formed on the gate insulating film 150 corresponding to a channel region. The gate electrode 161 may comprise a single or multi-metal layer.

Color filter layers 170 having different colors are formed on a surface of the gate insulating film 150 on which the driving transistor Tdr is not formed and pixels are defined. The color filer layers 170 corresponding to respective pixels have different red, green, and blue colors which are sequentially repeated.

A planarizing layer 180 is formed on the gate electrode 161, the color filer layer 170, and the gate insulating film 150. The planarizing layer 180 may be made of an organic material such as one of benzocyclobutenes (BCB), olefins, acrylic resins, polyimides, and fluorine resins.

A first electrode 190 as a transparent electrode is formed on the planarizing layer 180. The first electrode 190 is made of a transparent conductive material such as indium tin oxide (ITO) or indium zinc oxide (IZO). A contact hole 143 exposing the source electrode 141 is formed in the gate insulating film 150 and the planarizing layer 180, and the first electrode 190 is electrically connected to the source electrode 141 via the contact hole 143. The first electrode 190 is called an anode and supplies holes to an organic light diode layer 230.

A barrier 200 is formed between adjacent first electrodes 190. The barrier 200 distinguishes between the adjacent electrodes 190 to define a pixel region. The barrier 200 may be made of a photosensitive material having heat resistance and solvent resistance, such as an acryl resin, a polyimide resin, or the like, or an inorganic material such as $SiO_2$, $TiO_2$ or the like. The barrier 200 may have a double-layered structure of an organic layer and an inorganic layer.

An organic layer is formed on a portion of the first electrode 190, which is not covered by the barrier 200. The organic layer comprises a hole injecting layer 210, a hole transporting layer 220, an organic light emitting layer 230, an electron transporting layer 240 and an electron layer 250. In this exemplary embodiment, the method of manufacturing the display device includes cleaning the first electrode 190 by plasma-treating the first electrode 190 before depositing the organic layer on the first electrode 190. The plasma treating process is optional in the manufacturing method.

The hole injecting layer 210 may be made of amine derivatives having strong fluorescence, such as triphenyl diamine derivatives or styryl amine derivatives, or amine derivatives having an aromatic fused ring. In this exemplary embodiment, the hole injecting layer 210 may be made of a material (product name: "HI-406") available from Idemitsu Company, and is deposited at a thickness of about 600 Å. Since the aging operation improves the interfacial property between the first electrode 190 and the organic layer, the aging condition may be varied depending on the kind of hole injecting layer 210 in direct contact with the first electrode 190.

The hole transporting layer 220 may be made of an amine compound. In this exemplary embodiment, the hole transporting layer 220 may be made of a material (product name: "HT-320") available from Idemitsu Company, and is deposited at a thickness of about 200 Å.

The organic light emitting layer 230 may be made of a low molecular weight material that emits white light and is deposited using an open mask. In this exemplary embodiment, the organic light emitting layer 230 comprises a blue light emitting layer comprising a host of an aromatic compound and an aromatic amine compound of 8% doped into the host (product name: "BH-215:BD-119," 80 Å, available from Idemitsu Company), a blue light emitting layer comprising a host of an aromatic compound and an aromatic amine compound of 8% doped into the host (product name: "BH-215:GD-206," 60 Å, available from Idemitsu Company), and a red light emitting layer comprising a host of an aromatic compound (available from Gracel Company) and an aromatic compound (available from UDC Company) of 4% doped into the host (product name: "BH-215:BD-119", 150 Å). Light emitted from the organic light emitting layer 230 passes through the color filter layers 170 as red, green, and blue color light.

The electron transporting layer 240 is made of ALq3 and has a thickness of about 200 Å, and the electron injecting layer 250 is made of LiF and has a thickness of about 7 Å.

A second electrode 300 is formed on the barrier 200 and the electron injecting layer 250. The second electrode 300 is called a cathode and supplies electrons to the organic light emitting layer 230. The second electrode 300 may have a stacked structure of a calcium layer and a reflective metal layer. A layer having a low work function may be arranged at the side near the organic layer. Opaque metal such as aluminum or silver may be used as the reflective metal layer.

Holes transmitted from the first electrode 190 and electrons transmitted from the second electrode 300 are combined into excitons in the organic light emitting layer 230. The excitons emit light in a deactivation process.

If the second electrode 300 is made of an opaque material such as aluminum or silver, the light emitted from the organic light emitting layer 230 travels toward the insulating substrate 110, which is referred to as a bottom emission type.

Now, the lifetime of the display panel will be described when different aging conditions are applied to the display panel as configured above. In the aging process of the manufacturing method of the display device according to this exemplary embodiment, PV is applied to the display panel with parameters of temperature of 60° C. and 100° C., pulse amplitude of alternating voltage of 7V and 10V and time taken to perform the aging process of 0.5 hours and 2 hours. A first condition example (1) is a display panel that is not aging-processed, second to fifth condition examples (2) to (5) are display panels that are aging-processed at the temperature of 60° C., and sixth to ninth condition examples (6) to (9) are display panels that are aging-processed at the temperature of 100° C. The pulse amplitude of PV applied to the second, third, sixth and seventh (2), (3), (6) and (7) is 7 V, and the pulse amplitude of PV applied to the fourth, fifth, eighth and ninth (4), (5), (8) and (9) is 10 V. An optimal aging condition for the parameters can be found through such different condition examples.

FIG. 4 shows the time taken for luminance to decrease by 2% from its initial luminance (initial luminance reduction time (hrs-ΔL2%)), the initial luminance reduction time increase rate (%) compared to a display panel that is not aging-processed, the time at which luminance reduction rate becomes 50% when CC representing luminance of 5,000 nits is applied to the display panel (CC lifetime (hrs)), the CC lifetime increase rate (%), the threshold voltage increase value (ΔVth) of the driving transistor Tdr when the luminance reduction rate becomes 50%, the ΔVth reduction rate (%) representing the ratio of threshold voltage increase of an aging-processed display panel to a threshold voltage increase of the display panel that is not aging-processed, the overall lifetime (hrs) calculated based on the CC lifetime increase rate (%) and the ΔVth reduction rate (%), and the overall lifetime increase rate (%), according to 8 different aging conditions. A good aging effect is characterized by an increase above 100% of the initial luminance reduction time increase rate (%), the CC lifetime increase rate (%) and the overall lifetime increase rate (%). A decrease of the (Vth reduction rate (%) is a good aging effect.

The reason why the initial luminance reduction time (that is, the time taken for luminance to decrease by 2% from the initial value of luminance) is measured is that a user can recognize a change in luminance of the display panel when luminance typically decreases by 2% of the initial luminance. It can be seen from FIG. 4 that the time taken for the user to recognize reduction of luminance is 0.1 hours or so in the first condition example (1), but is longer than 0.1 hours in any other condition examples (2) to (9). Particularly, the fifth, seventh and ninth condition examples 5, 7 and 9 show that the initial luminance reduction time remarkably increases by the aging process with the initial luminance reduction time increase rate (%) increasing to larger than 1,200%.

Figure 5:
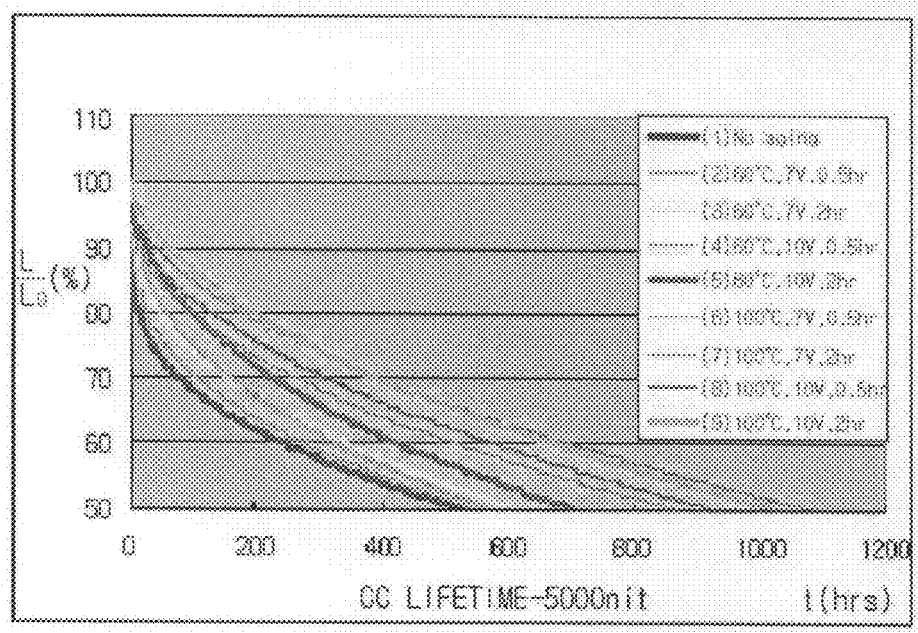

FIG. 5 shows the CC lifetime (hrs) shown in FIG. 4. As shown in FIG. 5, the CC lifetime (the time at which luminance decreases by 50% of the initial luminance) is 529 hours in the first condition example (1), while the CC lifetime increases above 529 hours in the second to ninth condition examples (2) to (9) that are aging-processed. Particularly, the CC lifetime in the ninth condition example (9) increases to 1,031 hours which are about double as long as 529 hours in the first condition example (1). It is noted herein that the CC lifetime in the sixth to ninth condition examples (6) to (9) having the aging temperature of 100 (C is superior to the CC lifetime in the second to fifth condition examples (2) to (5) having the aging temperature of 90 (C, irrespective of other conditions. In addition, in the aging process under conditions of the same temperature and the same time, the CC lifetime when the PV of 10 V is applied is generally longer than the CC lifetime in the case of the PV of 7 V, except that the ninth condition example (9) applied with the PV of 10 V is smaller in the CC lifetime than the seventh condition example (7). In addition, it can be seen from FIG. 5 that the aging time of 2 hours increases the CC lifetime than the aging time of 0.5 hours.

The amplitude of the PV pulse may lie between 5 V and about 30 V depending on the kind and property of the organic layer of the display panel. In addition, in case of the CV rather than the PV, a direct voltage of about 5 to 15 V may be applied, and the aging time may be adjusted in consideration of a pulse duty cycle at an optimal PV application time. For example, if the optimal PV application time is 2 hours and the duty cycle is 50%, the best aging effect can be obtained when the CV is applied for about 4 hours. In this manner, the duty cycle of the aging time may be adjusted to lie between 10% and 90%.

Figure 6:
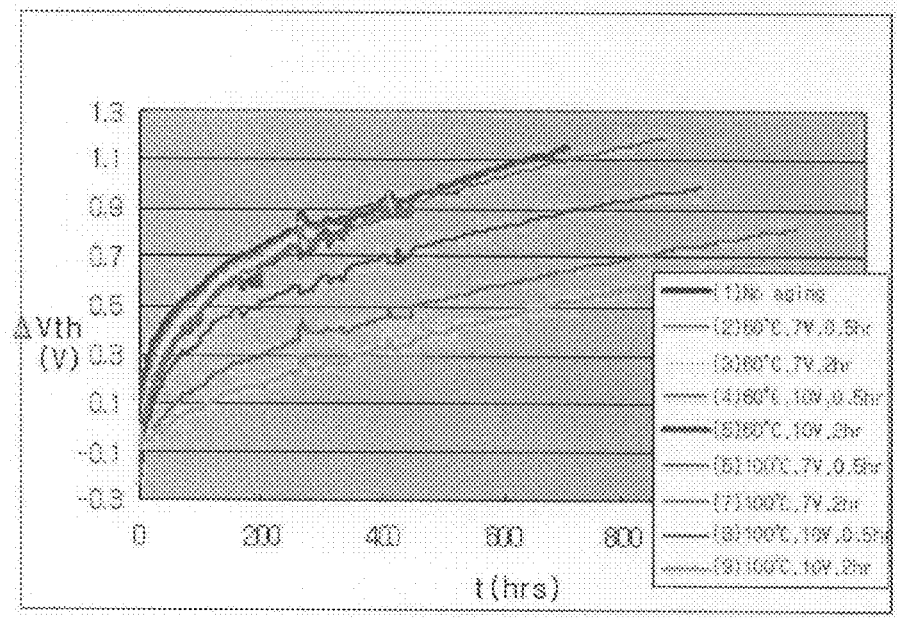

FIG. 6 shows the threshold voltage increase value ((Vth) of FIG. 4. In FIG. 6, a smaller threshold voltage increase value means a longer lifetime of the display panel. Accordingly, as described above, a smaller (Vth reduction rate (%) is more effective in increasing the lifetime of the display panel. The threshold voltage in all the condition examples (1) to (9) increases with time, and as can be seen from the graph of FIG. 6, although the second to sixth condition examples (2) to (6) are subjected to the aging operation, these examples are not larger in reduction of the threshold voltage increase value ((Vth) than the first condition example (1), while the aging effect for the ninth condition example (9) is remarkable. However, the example having the longest CC lifetime does not necessarily have the maximum (Vth reduction rate (%). Accordingly, the overall lifetime (hrs) is determined by considering both conditions.

Figure 7:
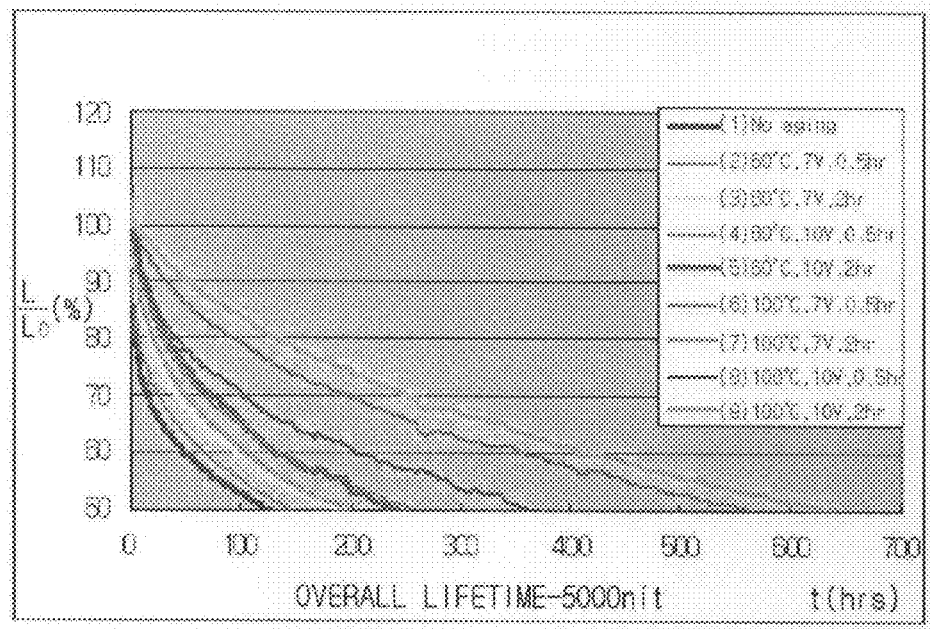

FIG. 7 shows the overall lifetime (hrs). In this exemplary embodiment, the display panel has the longest overall lifetime when it is aging-processed with application of the ninth condition example (9). The seventh condition example (7) gives the second longest overall lifetime and the eighth condition example (8) gives the third longest overall lifetime. The overall lifetime means time at which a value produced by calculating the luminance reduction rate generated when the CC is applied to the display panel and the luminance reduction rate according to increase of the (Vth for each hour correspond to 50% of an initial value. The overall lifetime is an indicator to allow a user to catch the lengthened lifetime of the aging-processed display panel. Accordingly, in this exemplary embodiment, when the PV having the amplitude of 10 V is applied to the display panel at the temperature of 100 (C for about two hours, the best aging effect can be obtained.

Figure 8:
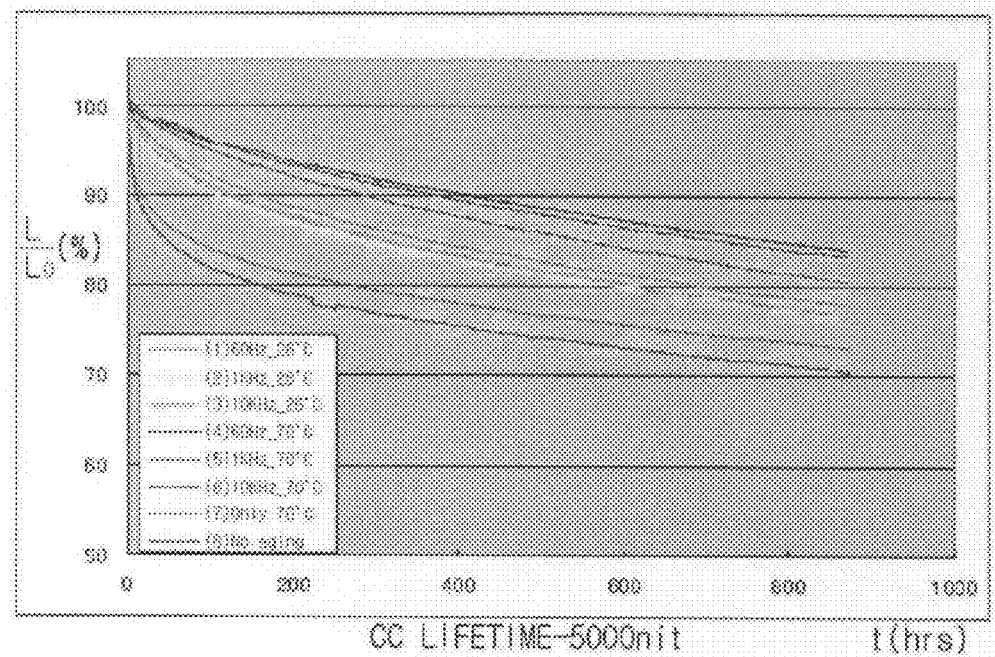

FIG. 8 is a graph showing a relationship between a frequency and a temperature when the PV is applied to a display panel. FIG. 8 shows the CC lifetime when a pulse frequency is changed to 60 Hz, 1 KHz and 10 KHz while a temperature is changed to 26 (C and 70 (C. In this case, the intensity of current applied to measure the CC lifetime is so adjusted that light having luminance of 1,000 nits is emitted from the display panel. The CC lifetime of the eighth condition example (8) which is not aging-processed is shortest. The seventh condition example (7) applied only with the temperature of 70 (C without any electrical signal is longer in the CC lifetime than the eighth condition example (8), but shorter in the CC lifetime than the other condition examples (1) to (6) applied with any electrical signal. The first to third condition examples (1) to (3) applied with the temperature of 26 (C are shorter in the CC lifetime than the fourth to sixth condition examples (4) to (6) applied with the temperature of 70 (C. Accordingly, the aging temperature may be set to be at least more than 70 (C, more preferably, greater than 80 (C and less than 120 (C. Alternatively, the aging temperature may be set to be between 80 (C and 90 (C in consideration of a temperature characteristics of a circuit part connected to the display panel.

In addition, under the same temperature conditions, the CC lifetime of the first and fourth condition examples (1) and (4) having the frequency of 60 Hz is longer than the CC lifetime of other condition examples having the frequencies of 1 KHz and 10 KHz. Although the CC lifetime is lengthened even when the pulse frequency applied in the aging process is 1 KHz to 10 KHz, the pulse frequency is more preferably 50 Hz to 60 Hz. In this exemplary embodiment, the display panel has the most appropriate CC lifetime at the frequency of 60 Hz.

Figure 9:
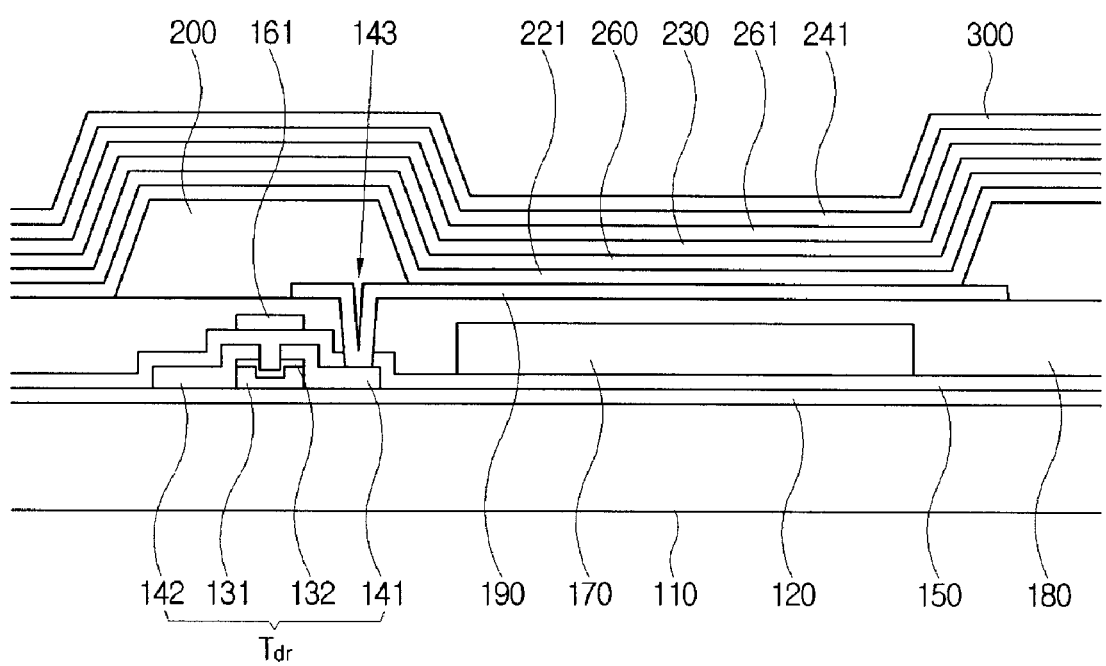

FIGS. 9 to 13 are views for explaining an aging effect of a display device according to a second exemplary embodiment of the invention. In the second exemplary embodiment, as shown in FIG. 9, the display device comprises a hole transporting layer 221, with a predetermined material doped therein, on the first electrode 190, and an electron transporting layer 241, with a predetermined material doped therein, below the second electrode 300, instead of the hole injecting layer and the electron injecting layer in the first exemplary embodiment, respectively. The hole transporting layer 221 is made of a material comprising a 300 Å thick aromatic compound (product name: "NHT5," available from Novaled Company) with an aromatic compound (product name: "NDP2," available from Novaled Company) of about 1.5 wt % doped therein, and the electron transporting layer 241 is made of a material comprising a 300 Å thick aromatic compound (product name: "NET5," available from Novaled Company) with an aromatic compound (product name: "NDN1," available from Novaled Company) of about 8 wt % doped therein.

In addition, an electron blocking layer 260 to prevent electrons from moving to the hole transporting layer 221 is interposed between the organic light emitting layer 230 and the hole transporting layer 221, and a hole blocking layer 261 to prevent holes from moving to the electron transporting layer 241 is interposed between the organic light emitting layer 230 and the electron transporting layer 241. The electron blocking layer 260 is made of an aromatic compound (product name: "NPD," available from Gracel Company), and the hole blocking layer 261 is made of a material comprising a 100 Å thick Alq3 (product name: "NHT5," available from NSCC Company) with an aromatic compound (product name: "NET5," available from Novaled Company) of about 33% doped therein.

In addition, in this exemplary embodiment, the organic light emitting layer 230 comprises blue, green, and red light emitting layers that contain impurities and are stacked in order on the first electrode 190. A buffer layer made of an amine compound is interposed between the green and red light emitting layers.

As shown in FIG. 10, the first condition example (1) is a display panel that is not aging-processed, the second to fifth condition examples (2) to (5) are display panels applied with CC, and the sixth to ninth condition examples (6) to (9) are display panels applied with PCV. When the CC is applied, the aging process lasts for 2 hours, and when the PCV is applied, the aging process lasts for 4 hours. A PCV duty cycle is adjusted to be 50%, and a pulse low signal of about 0 V is applied. The intensity of current applied to the display panel is so adjusted that luminance of light emitted from the display panel becomes 3,000 nits and 5,000 nits.

Figure 11:
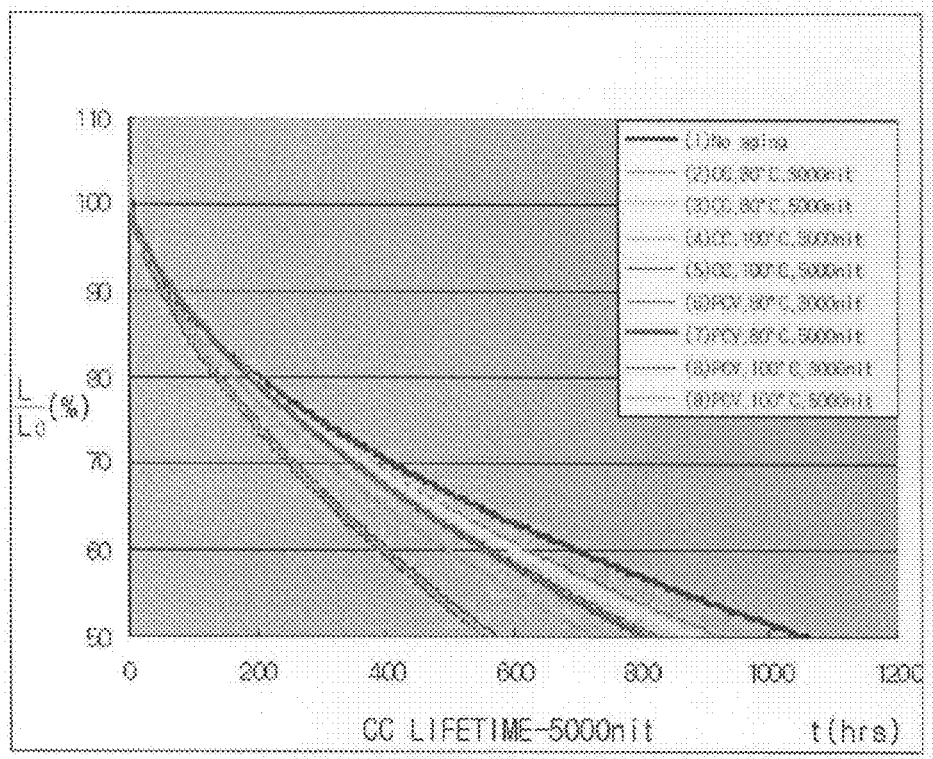
Figure 12:
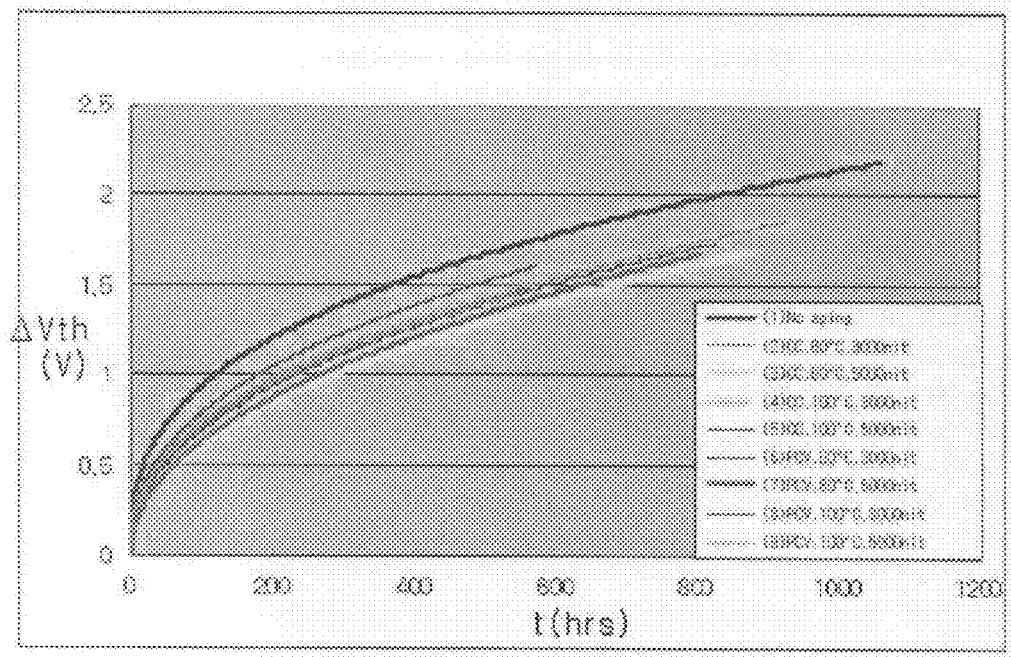

Under such conditions, the initial luminance reduction time increase rate (%) increases by greater than 200% in the third and seventh condition examples (3) and (7). As shown in FIG. 11, however, the CC lifetime of the second to ninth condition examples (2) to (9) that are aging-processed is shorter than the CC lifetime of the first condition example (1) that is not aging-processed. That is, although the second to ninth condition examples (2) to (9) are aging-processed, the CC lifetime increase rate (%) of these condition examples (2) to (9) is less than 100%. On the other hand, as shown in FIG. 12, the threshold voltage increase value ((Vth) of the second to ninth condition examples (2) to (9) that are aging-processed is smaller than that of the first condition example (1). Particularly, the (Vth reduction rate (%) of the third and seventh condition examples (3) and (7) is less than 70%.

Figure 13:
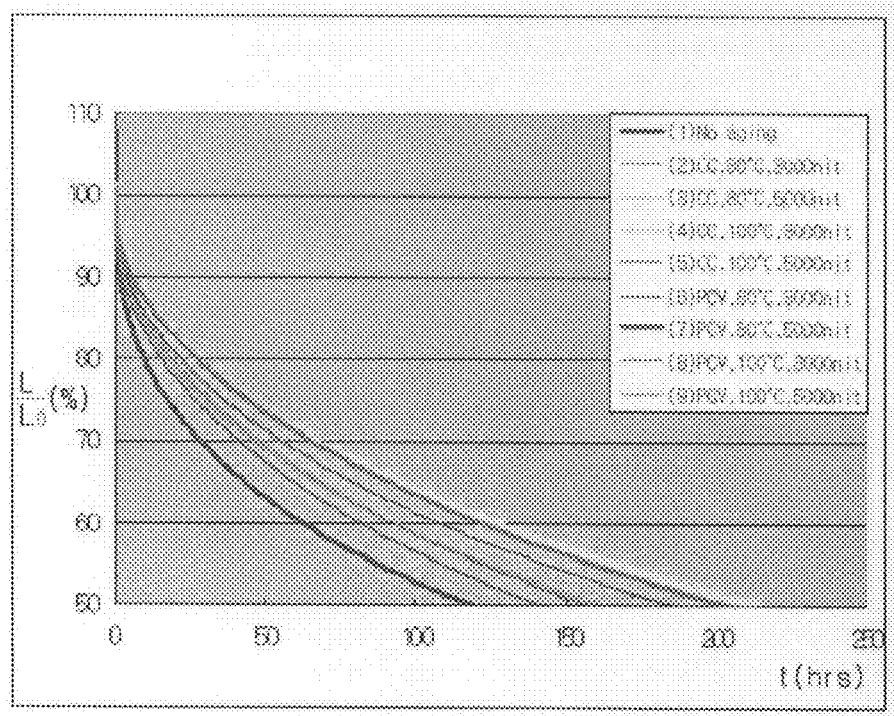

FIG. 13 shows the overall lifetime, the CC lifetime, and the threshold voltage increase value. As can be seen from FIG. 13, the second to ninth condition examples (2) to (9) that are aging-processed are longer in the overall lifetime than the first condition example (1), and the overall lifetime of the third and seventh condition examples (3) and (7) having the (Vth reduction rate (%) of less than 70% remarkably increases to 213 and 203 hours, respectively. That is, in the display panel according to this exemplary embodiment, the best aging effect can be obtained when the CC is applied for 2 hours or so at the temperature of less than 100 (C or when the PCV is applied for 4 hours or so at the temperature of less than 100 (C, and a better aging effect can be obtained when the luminance of the display panel is 3,000 nits or more, preferably, 5,000 nits.

FIGS. 14 to 17 are views for explaining an aging effect of a display panel according to a third exemplary embodiment of the invention. In the third exemplary embodiment, the display panel comprises a hole transporting layer without impurities doped therein and an electron transporting layer with impurities doped therein. The electron transporting layer is made of a material comprising a 200 Å thick aromatic compound (product name: "NET5," available from Novaled Company) with an aromatic compound (product name: "NDN1," available from Novaled Company) of about 8 wt % doped therein. The display panel according to this exemplary embodiment is a modification of the organic layer in the second exemplary embodiment.

As shown in FIG. 14, the first condition example (1) is a display panel that is not aging-processed, the second to fifth condition examples (2) to (5) are display panels applied with CC, and the sixth to ninth condition examples (6) to (9) are display panels applied with PCV. When the CC is applied, the aging operation lasts for 2 hours, and when the PCV is applied, the aging operation lasts for 4 hours. A PCV duty cycle is adjusted to be 50%, and a pulse low signal of about 0 V is applied. The intensity of current applied to the display panel is so adjusted that luminance of light emitted from the display panel becomes 3,000 nits and 5,000 nits.

Figure 15:
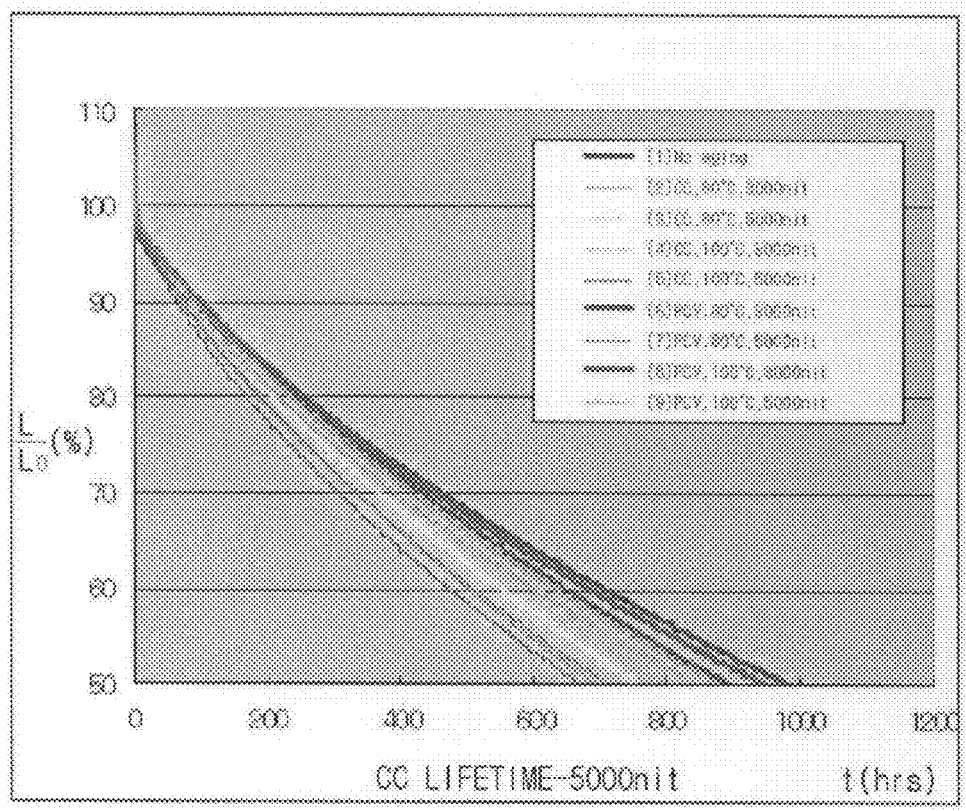

Under such conditions, the initial luminance reduction time increase rate (%) increases by 200% or so in most of the condition examples that are aging-processed. As shown in FIG. 15, like FIG. 11, however, the CC lifetime of the second to ninth condition examples (2) to (9) that are aging-processed is shorter than the CC lifetime of the first condition example (1) that is not aging-processed. That is, although the second to ninth condition examples (2) to (9) are aging-processed, the CC lifetime increase rate (%) of these condition examples (2) to (9) is less than 100%. Particularly, the CC lifetime increase rate (%) of the sixth and eighth condition examples (6) and (8) is larger than 90%.

Figure 16:
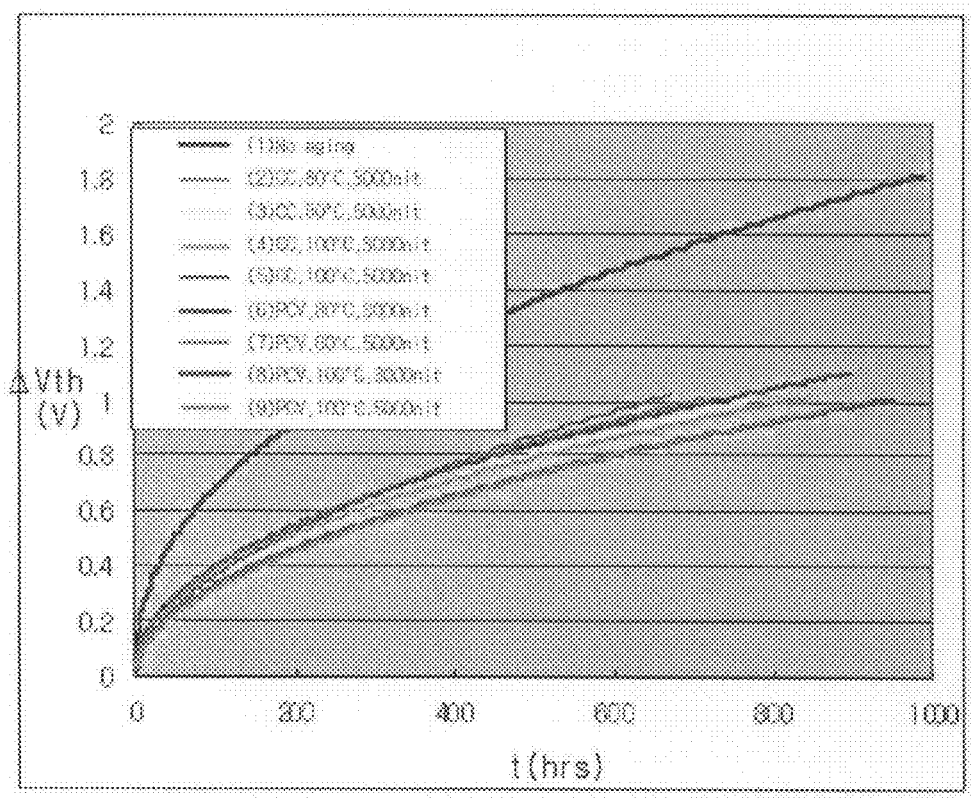

On the other hand, as shown in FIG. 16, the threshold voltage increase value ((Vth) of the second to ninth condition examples (2) to (9) that are aging-processed is smaller than that of the first condition example (1). Particularly, the (Vth reduction rate (%) of the eighth and ninth condition examples (8) and (9) is 50% or so.

Figure 17:
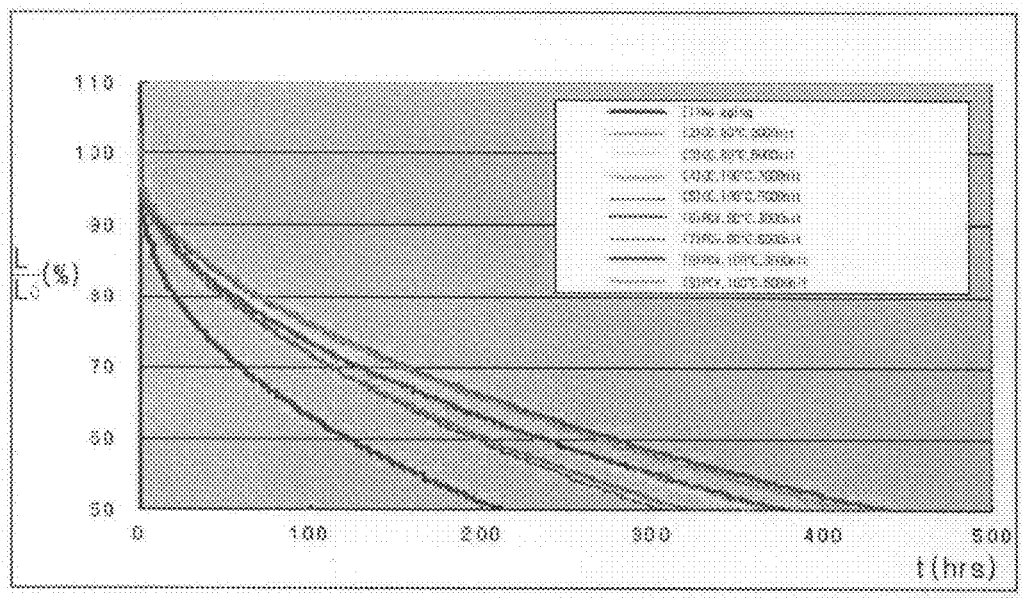

As can be seen from FIG. 17 showing the overall lifetime, the second to ninth condition examples (2) to (9) that are aging-processed are longer in the overall lifetime than the first condition example (1), and the overall lifetime of the eighth and ninth condition examples (8) and (9) having the (Vth reduction rate (%) of 50% or so remarkably increases to 437 and 421 hours, respectively. That is, in the display panel according to this exemplary embodiment, the best aging effect can be obtained when the PCV is applied for 4 hours at the temperature of 100 (C.

Numerical values for the electrical signals and the temperature applied to the different display panels may be varied depending on the property and size of organic layers of the display panels. In the display panels using the organic layers used in the above-described exemplary embodiments, the lifetime of the display panels can be increased by aging the display panels by applying the electrical signals to allow light with luminance of more than 10 nits and less than 10,000 nits to be emitted from the display panels at the temperature of more than 70 (C and less than 120 (C, preferably less than 100 (C, for 0.5 to 4 hours.

As apparent from the above description, the present invention provides a manufacturing method of a display device which increases the durability (or lifetime) of the light emitting layer and decreases the rate of increase of the driving voltage, which results in lengthening the lifetime of the display device.

In addition, the present invention provides a manufacturing method of a display device that decreases the rate at which luminance decreases from its initial value.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A method of manufacturing a display device having a display panel including a first electrode, a light emitting layer formed on the first electrode, and a second electrode on the light emitting layer, the method comprising:

aging the display panel by applying an alternating voltage and a predetermined temperature to the display panel so that the luminance of the light emitting layer lies between about 10 nits and 10,000 nits, wherein the pulse amplitude of the alternating voltage is about 10V, and wherein aging the display panel lasts for about 0.5 to 4 hours.

2. The method according to claim 1, wherein the frequency of the alternating power is 50 to 10,000 Hz.

3. The method according to claim 1, wherein the duty cycle of the alternating power is about 10 to 90%.

4. The method according to claim 1, wherein aging the display panel comprises heating the display panel at temperature of about 70 to 120° C.

5. A method of manufacturing a display having a display panel including a first electrode, a light emitting layer formed on the first electrode, and a second electrode on the light emitting layer, the method comprising;

aging the display panel by applying a predetermined level of direct voltage and a predetermined level of direct current alternately at a predetermined temperature to the display panel so that the luminance of the light emitting layer lies between about 100 nits and 10,000 nits.

6. The method according to claim 5, wherein aging the display panel lasts for about 0.5 to 4 hours.

7. The method of claim 5, wherein the aging of the display panel comprises heating the display panel at a temperature of about 70° to 120° C.

* * * * *